United States Patent
Bang et al.

(10) Patent No.: US 6,878,630 B2
(45) Date of Patent: Apr. 12, 2005

(54) METHOD OF MANUFACTURING A WAFER

(75) Inventors: Chull Won Bang, Kyungki-Do (KR); In Cheol Kim, Kyungki-Do (KR); Dong Won Back, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 243 days.

(21) Appl. No.: 10/238,233

(22) Filed: Sep. 10, 2002

(65) Prior Publication Data

US 2003/0068891 A1 Apr. 10, 2003

(30) Foreign Application Priority Data

Sep. 10, 2001 (KR) .......................... 2001-55451

(51) Int. Cl.[7] ...................... H01L 21/302; H01L 21/462
(52) U.S. Cl. ..................... 438/692; 438/693; 451/29; 451/41
(58) Field of Search ............................ 438/455–460, 438/690–693; 451/29, 41

(56) References Cited

U.S. PATENT DOCUMENTS

| | | | | |
|---|---|---|---|---|
| 4,269,654 A | * | 5/1981 | Deckert et al. | 438/756 |
| 5,679,212 A | * | 10/1997 | Kato et al. | 438/692 |
| 5,855,735 A | * | 1/1999 | Takada et al. | 438/691 |
| 5,963,821 A | * | 10/1999 | Kai et al. | 438/460 |
| 5,964,953 A | * | 10/1999 | Mettifogo | 134/2 |
| 6,162,730 A | * | 12/2000 | Kai et al. | 438/690 |
| 6,227,944 B1 | * | 5/2001 | Xin et al. | 451/41 |
| 6,245,677 B1 | | 6/2001 | Haq | |
| 6,716,722 B1 | * | 4/2004 | Furihata et al. | 438/459 |

* cited by examiner

*Primary Examiner*—Duy-Vu N. Deo
(74) *Attorney, Agent, or Firm*—Marshall, Gerstein & Borun LLP

(57) ABSTRACT

A method of manufacturing a wafer. The surface of a wafer for which a lapping process is completed is exposed to a caustic etch process so that the etch rate against the surface of the wafer ranges from about 0.3 to about 0.7 $\mu$m/min using an etchant containing from about 42 to about 48% KOH and from about 52 to about 58% $H_2O$. Then, a wafer back side polishing process is controlled in order to prevent a sliding phenomenon without a drop in a chucking voltage. Therefore, a lift-off or peeling phenomenon of a subsequently deposited film is reduced and local variations in the etch rate is also reduced.

14 Claims, 4 Drawing Sheets

METHOD OF MANUFACTURING A WAFER

BACKGROUND

1. Technical Field

A method of manufacturing a wafer is disclosed, and more particularly, a method of manufacturing a wafer is disclosed which is capable, in advance, of preventing problems occurring in processes for manufacturing semiconductor devices, by reducing a lift-off or peeling phenomenon of certain films or variations in etch rate depending on regions in the film when a process of etching the semiconductor devices is performed.

2. Description of the Related Art

Today, silicon wafers are widely used as starting materials for manufacturing semiconductor devices. Silicon wafers are essentially thin crystal silicon plates made from polysilicon. Silicon, usually in the form of oxide silicon ($SiO_2$) exists naturally as sand and rocks and constitutes about ⅓ of the earth's crust. Therefore, silicon not only is an abundant material in unlimited supply and also is a material that is good for the environment because it is non-toxic.

Further, as a silicon wafer has a wide energy band gap (1.2 eV), there is an advantage that a device made of silicon can be driven at relatively high temperatures (about up to 200° C.). Due to this advantage, silicon wafers are used to make various shapes of semiconductor devices such as DRAM, ASIC, TR, CMOS, ROM, EPROM, EEPROM, flash EEPROM, or the like in the semiconductor industry. These devices are used in the fields of computers, electronic products, industry machines, satellite, and the like.

Silicon wafers may be classified as a polished wafer, an epitaxial wafer, SOI water (silicon on insulator wafer), a diffused wafer, a HI wafer, or the like.

The polished wafer is the most common wafer. The polished wafer is produced by a process of making a cylindrical polysilicon ingot, cutting the ingot into wafers of a given thickness and then performing polishing, etching, mirror machining and cleaning.

The epitaxial wafer is a wafer on which another single crystal layer is grown on an existing silicon wafer. The epitaxial wafer has advantages that surface defects are lower than an existing silicon wafer and the concentration and type of impurities can be controlled.

The SOI wafer is a wafer in which an insulating thin film is inserted into the silicon wafer. In the SOI wafer, an insulating film is formed on the silicon wafer substrate. A single crystal silicon film on which an integrated circuit will be formed is then formed on the insulating film.

The diffused wafer is a wafer in which a dopant is diffused in a furnace to deposit the dopant on both sides of the silicon wafer and one side of the silicon wafer is polished.

The HI wafer is produced by performing the silicon wafer under a hydrogen gas atmosphere of a high purity. The HI wafer has almost zero crystal defects since the concentration of oxygen on the surface of the silicon wafer is very low.

Generally, the wafer manufacture process includes an ingot process S11, a slicing process S12, an edge grinding process S13, a lapping process S14, an etch process S15, a back side polishing process S16, a pre-anneal cleaning process S17, an edge polishing process S18 and a front-side polishing process S19, as shown in FIG. 1.

In the ingot process S11, silicon (Si) is induced from sand and is then purified to make a silicon raw material. A desired impurity is then injected to make a N-type or P-type silicon ingot.

In the sliding process S12, the N-type or P-type silicon ingot produced in the ingot process S11 is cut to have a desired diameter, for example 5 inch, 6 inch, 8 inch, 10 inch, 12 inch, etc.

In the edge grinding process S13, in order improve the damages and roughness at an edge portion of the wafer that are caused by the sliding process S12, the edge portion of the wafer is polished.

In the lapping process S14, in order to improve the flatness on the front/back surfaces of the wafer that has been cut to a given thickness, ranging from about 0.5 mm to about 0.8 mm, the front/back side surface of the wafer is polished.

In the etch process S15, in order to remove remaining fine cracks or defects on the surface of the wafer that is polished in the lapping process S14, the surface of the wafer is etched using a chemical reaction.

In the back side polishing process S16, in order to improve the flatness of the back side surface of the wafer by the etch process S15, the back side surface of the of the wafer is polished.

In the pre-anneal cleaning process S17, in order to compensate for an incomplete lattice defect structure occurring on the surface that is caused by the etch process S15, annealing and cleaning processes are performed for the surface of the wafer.

In the edge polishing process S18, in order to reduce surface damage and poor flatness at the edge portion of the wafer caused by the etch process S15, the edge portion of the wafer is polished.

Finally, in the front-side polishing process S19, in order to improve the damage and flatness of the front side of the wafer occurring by the etch process S15, the front side of the wafer is polished.

In the above wafer manufacture process, the etch process S15 can vary. The surface roughness of the wafer and the step at the central portion and the edge portion of the wafer are different depending on the etch process utilized. The available etch processes include an acid etch, a caustic etch+acid etch, and a caustic etch.

When the wafer etch process is performed using an acid etch, as the acid etch usually employs etchants such as $CH_3COOH$, HF, NaCOOH, or the like, violent reaction occurs within a wet station bath in which the wafer is seated. A rapid etch rate can be thus obtained. However, the roughness at the of the back side portion of the wafer becomes very great. Also, the edge portion of the wafer is etched more than the central portion of the wafer. Thus, a profile in which the step at the central portion and the edge portion of the wafer becomes severe, as shown in FIG. 2A.

When the wafer etch process is performed simultaneously using acid etch and the caustic etch, though the roughness of the back side of the wafer is improved over the back side of the wafer shown in FIG. 2A, as shown in FIG. 2B, a profile having a steep step between the central portion and the edge portion of the wafer is formed due to a rapid etch rate of the acid etch.

When the wafer etch process is performed using the caustic etch, the step between the central portion and the edge portion of the wafer is much improved, as shown in FIG. 2C. The roughness of the back side of the wafer is improved than when the acid etch is applied and is degraded than when the acid etch and the caustic etch are simultaneously applied.

When the wafer etch process is performed using the acid etch or acid etch+caustic etch process, the step between the central portion and the edge portion of the wafer causes a lift-off or peeling phenomenon in which when a poly silicon layer, an oxide film, a nitride film, a metal layer, etc. for forming circuit patterns in semiconductor devices are etched, can lift off or become separated at the edge portion of the wafer.

In the above wafer manufacturing processes, the wafer back side polishing process is one of the important processes. The roughness of the back side of the wafer determined by the wafer back side polishing process affects the etch process during the process of manufacturing the semiconductor devices, which will be below described by reference to FIG. 3A and FIG. 3B.

As shown in FIG. 3A, in a process of etching a polysilicon layer, an oxide film, a nitride film, a metal layer, etc. using the wafer the back side surface of which is planarized by the wafer back side polishing process, the applied chucking voltage becomes higher while the wafer back side is completely seated into the ESC (electro-static-chuck) which holds the wafer. An increasing force is generated by an ionized etchant, for example fluorine ion (F+), which is dragged toward the surface at the front side of the water being a negative (−). Due to this, though there is an advantage that the etch rate is increased, there is a possibility that a sliding phenomenon may occur when the wafer is loaded onto the ESC. Thus, there are problems that the wafer may be broken or defects in the wafer surface may occur.

As shown in FIG. 3B, a process of manufacturing using semiconductor devices a wafer in which the roughness of the wafer back side surface is severe even with the wafer back side polishing process will be described as an example. When a process of etching the polysilicon layer, the oxide film, the nitride, the metal layer, etc. is performed, the chucking voltage being applied becomes higher while the wafer back side is incompletely adhered to the ESC (electro-static-chuck). The force generated by the ionized etchant, for example fluorine ion (F+), is dragged toward the surface at the front side of the water being a negative (−) band is increased. This lowers the adhesive force between the wafer and the ESC which further exacerbates the problems caused by the roughness at the back side of the wafer. Thus, the potential of the voltage applied is distributed which causes a degradation of the etch rate. According to experimental data, when the oxide film is etched, the etch rate is reduced locally by 3 to 5%. This variation in the etch rate is a margin sufficient to cause defects in which the contact hole is actually not opened.

When an etch fill process for patterning is performed, for example when the polysilicon layer, the oxide film, the nitride, the metal layer, etc are etched, variations in the etch rate is repeatedly overlapped since most of the equipment is of a ESC type, while the entire profile is greatly varied. If the size of the wafer is expanded from 8 inch to 10 to 12 inches, variations in the etch rate occurring by the difference in the wafer manufacture process is further increased, as the surface area of the wafer widens.

As described above, in order to reduce defects caused by the etch process and the lift-off phenomenon in the manufacture process of the semiconductor devices, it is required that the roughness at the entire portions of the wafer back side and the step of the wafer back side edge be considered in designing the wafer manufacture process. In other words, it is required that the roughness at the entire portions of the wafer back side be adequately reduced while the step between the central portion at and the edge portion of the wafer be removed. If so, a sliding phenomenon can be prevented when a process of etching the semiconductor devices is performed. Further, defective etch processes due to variation in a local etch rate can be prevented. In order to satisfy these conditions, it is preferred that a caustic etch process is used and the condition of a subsequent wafer back side process is properly controlled.

SUMMARY OF THE DISCLOSURE

A method of manufacturing a wafer is disclosed which is capable of, in advance, preventing the aforenoted problems, by reducing a lift-off phenomenon of a given film or variations in the width of the etch rate depending on regions in the film when a process of etching the semiconductor devices is performed, in a way that a caustic etch process condition is optimized to reduce the step between the central portion and edge portion of the wafer by maximum and a wafer back side polishing process condition is controlled in order to prevent a sliding phenomenon without drop in the chucking voltage.

A disclosed method of manufacturing a wafer comprises performing an ingot process, a sliding process, an edge grinding process and a lapping process, thereby creating a wafer; etching the entire surface of the wafer using an etchant which is KOH diluted with water; polishing the back side of the wafer; and performing a pre-anneal cleaning process, an edge polishing process and a front polishing process.

BRIEF DESCRIPTION OF THE DRAWINGS

The aforementioned aspects and other features of the disclosure will be explained in the following description, taken in conjunction with the accompanying drawings, wherein.

DETAILED DESCRIPTION OF THE PRESENTLY PREFERRED EMBODIMENTS

Figure 1:
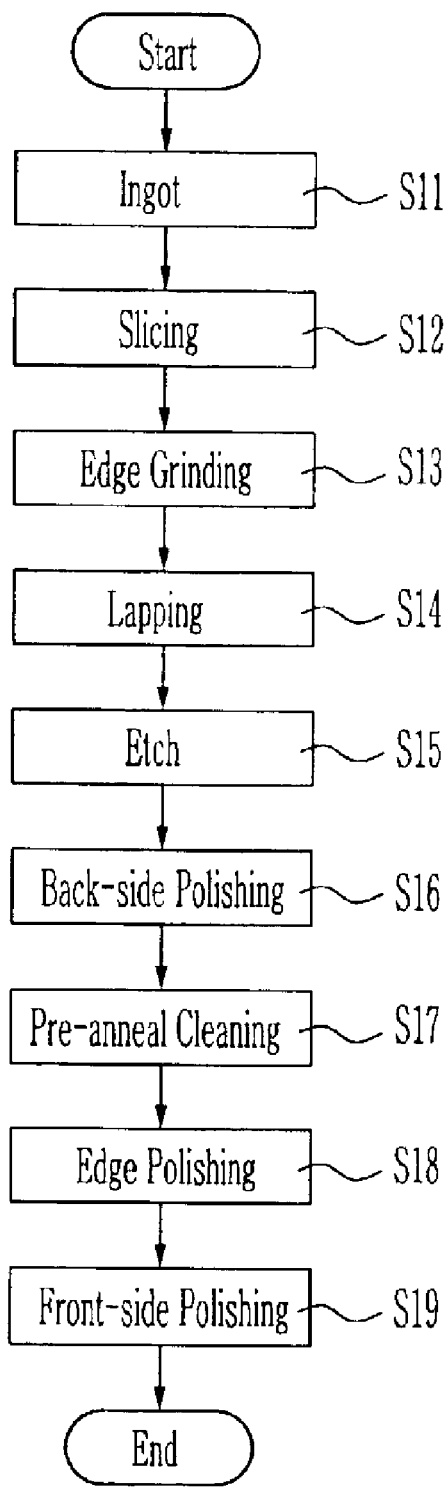
FIG. 1 is a flow chart showing a conventional method of manufacturing a wafer.
Figure 2A:
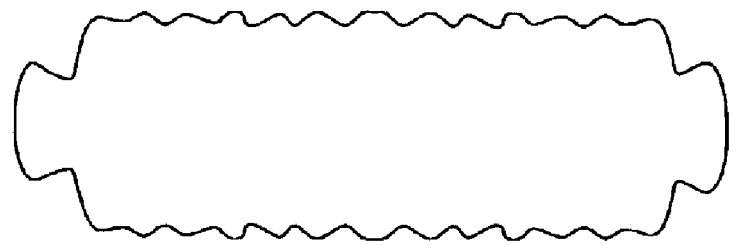
FIGS. 2A to FIG. 2C are cross-sectional views of wafer showing a profile of the wafer depending on an etching process condition shown in FIG. 1.
Figure 2B:
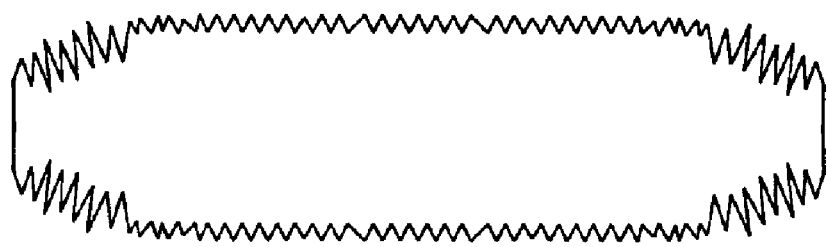
Figure 2C:
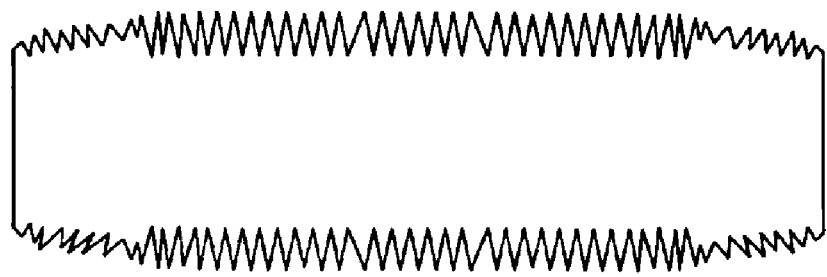
Figure 3A:
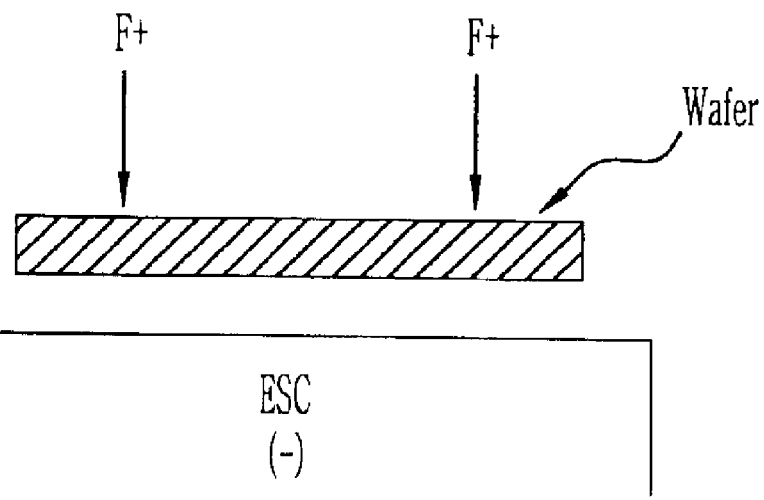
FIGS. 3A and FIG. 3B are drawings for explaining an influence that affects the etching process of semiconductor devices depending on a back side polishing process in the wafer shown in FIG. 1.
Figure 3B:
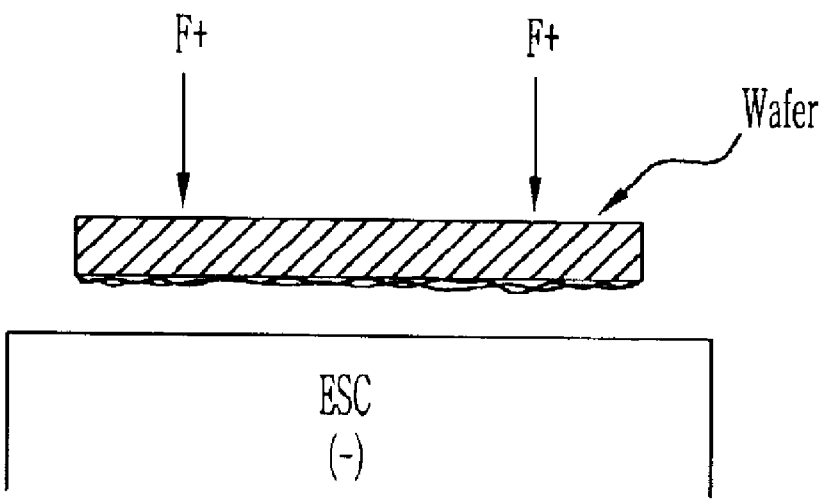
Figure 4:
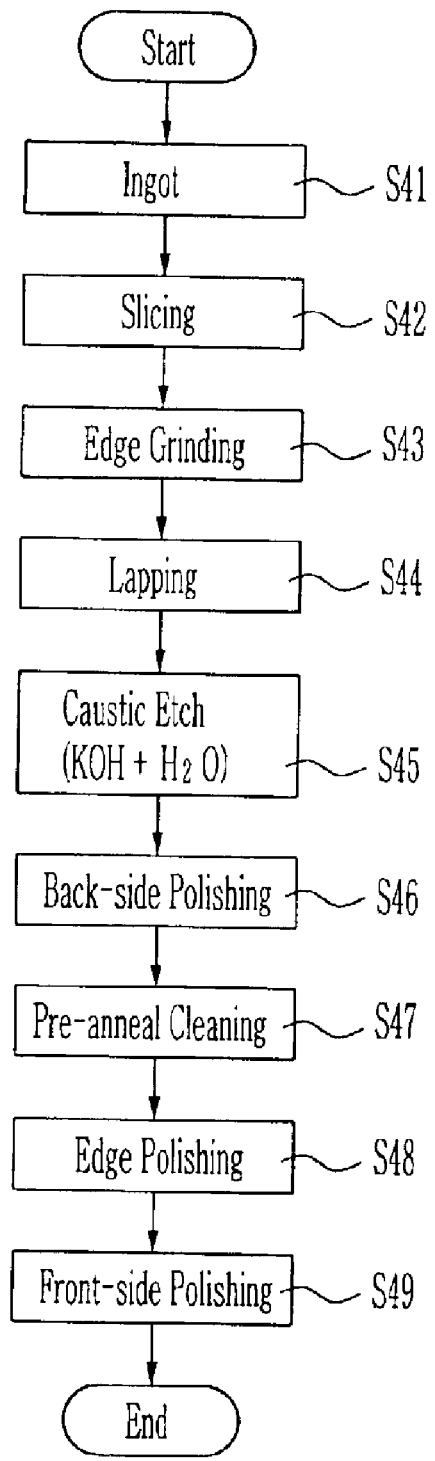
FIG. 4 is a flowchart of a disclosed method of manufacturing a wafer according to a preferred embodiment.

FIG. 4 is a flowchart for explaining a disclosed method of manufacturing a wafer according to a preferred embodiment.

Referring to FIG. 4, the wafer manufacture process includes an ingot process S41, a slicing process S42, an edge grinding process S43, a lapping process S44, a caustic etch process S45, a back side polishing process S46, a pre-anneal cleaning process S47, an edge polishing process S48 and a front-side polishing process S49.

It should be noted that the wafer process steps are not limited to the above steps. Instead, the edge grinding process S43 and the lapping process S44 may reversed, and the back side polishing process S46 and the pre-anneal cleaning process S47 or the edge polishing process S48 may be reversed. Further, the front-side polishing process S49 and the back side polishing process S46 or the pre-anneal cleaning process S47 may be reversed.

In the ingot process S41, silicon (Si) is induced from sand and is then purified to make a silicon raw material. A desired impurity is then injected to make a N-type or P-type silicon ingot.

In the sliding process S42, the N-type or P-type silicon ingot produced in the ingot process S41 is cut to have a desired diameter, for example 5 inch, 6 inch, 8 inch, 10 inch, 12 inch, etc.

In the edge grinding process S43, in order improve the damages and roughness at an edge portion of the wafer that are caused by the sliding process S42, the edge portion of the wafer is polished.

In the lapping process S44, in order to improve the damages and flatness on the front/back side surface of the wafer that is cut to have a given thickness, for example from about 0.5 mm to about 0.8 mm, the front/back side surface of the wafer is polished.

In the caustic etch process S45, in order to remove remaining fine cracks or defects on the surface of the wafer that is polished in the lapping process S44, an etchant in which $H_2O$ is diluted into KOH being an etch raw solution is employed. In order to reduce the step between the central portion and the edge portion of the wafer by maximum, the etchant contains $H_2O$ and KOH which are mixed so that the etch rate against the surface of the wafer ranges from about 0.3 to about 0.7 $\mu$m/min. In the etchant, KOH is present in an amount ranging from about 42 to about 48%, preferably 45% and $H_2O$ is present in an amount ranging from about 52 to about 58%, preferably 55%. During the wafer etch process, the temperature of the etchant ranges from about 65 to about 85° C., preferably 75° C. $H_2O$ contains deionized water (DI). The caustic etch process is performed until the thickness etched at the front and back side of the wafer, respectively ranges from about 8 to about 12 $\mu$m.

In the back side polishing process S46, in order to improve the damages and flatness of the back side surface of the wafer by the etch process S45, the back side surface of the wafer is polished. In order to prevent a sliding phenomenon when the semiconductor devices are loaded onto the ESC while not lowering the chucking voltage applied to the wafer back side during the process of etching the semiconductor devices, the back side polishing process condition is established as follows. First, it is required that the amount or extent of the wafer back side polished range from about 1 to about 2 $\mu$m. Second, it is required that 80 to 98% of the entire surface area of the wafer back side contact the ESC. Finally, it is required that the "RMS" (root-mean-square) roughness value of the wafer back side ranges from about 20 to about 70 $\mu$m.

In the pre-anneal cleaning process S47, in order to compensate for an incomplete lattice defect structure occurring on the surface that is caused by the etch process S45, annealing and cleaning processes are performed on the surface of the wafer.

In the edge polishing process S48, in order to the reduce surface damage and poor flatness at the edge portion of the wafer caused by the etch process S45, the edge portion of the wafer is polished.

Finally, in the front-side polishing process S49, in order to reduce the surface damage and poor flatness of the front side of the wafer caused by the etch process S45, the front side of the wafer is polished.

As mentioned above, a wafer is manufactured by optimizing a caustic etch process and wafer back side polishing process condition among a wafer manufacture process condition. When a process of etching semiconductor devices, the lift-off or peeling phenomenon of a given film or locally occurring as a result of variations in the etch rate can be reduced. Therefore, the disclose methods have advantages in that they can improve reliability and throughput of the semiconductor devices.

The disclosed methods have been described with reference to a particular embodiment in connection with a particular application. Those having ordinary skill in the art and access to the teachings of the disclosed methods will recognize additional modifications and applications within the scope thereof.

It is therefore intended by the appended claims to cover any and all such applications, modifications, and embodiments within the scope of this disclosure.

What is claimed is:
1. A method of manufacturing a wafer comprising:
  performing an ingot process, a sliding process, an edge grinding process and a lapping process, thereby creating a wafer;
  etching an entire surface of the wafer using an etchant comprising KOH and $H_2O$;
  polishing a back side of the wafer, wherein the polishing of said back side is performed until from about 80 to about 98% of a surface area of said back side can make contact with an electro-static-chuch ("ESC"); and
  performing a pre-anneal cleaning process, an edge polishing process and a front side polishing process.
2. The method as claimed in claim 1, wherein the etching of the wafer is carried out at an etch rate ranging from about 0.3 to about 0.7 $\mu$m/min.
3. The method as claimed in claim 1, wherein the etchant comprises KOH in an amount ranging from about 42 to about 48 wt. % and $H_2O$ in an amount ranging from about 52 to about 58 wt. %.
4. The method as claimed in claim 1, wherein the etchant has a temperature ranging from about 65 to about 85° C.
5. The method as claimed in claim 1, wherein the etching of the wafer is performed until a thickness of the wafer ranges from about 8 to about 12 $\mu$m.
6. The method as claimed in claim 1, wherein the polishing of said back side is performed until a thickness of the wafer is reduced by an amount ranging from about 1 to about 2 $\mu$m.
7. The method as claimed in claim 1, wherein the polishing of said back side is performed until a root-mean-square ("RMS") value said back side ranges from about 20 to about 70 $\mu$m.
8. A method of manufacturing a wafer comprising:
  performing an ingot process, a sliding process, an edge grinding process and a lapping process, thereby creating a wafer;
  etching an entire surface of the wafer using an etchant comprising KOH and $H_2O$;
  polishing a back side of the wafer, wherein the polishing of said back side is performed until a root-mean-square ("RMS") roughness value of said back side ranges from about 20 to about 10 $\mu$m; and
  performing a pre-anneal cleaning process, an edge polishing process and a front side polishing process.
9. The method as claimed in claim 8, wherein the etching of the wafer is carried out at an etch rate ranging from about 0.3 to about 0.7 $\mu$m/min.
10. The method as claimed in claim 8, wherein the etchant comprises KOH in an amount ranging from about 42 to about 48 wt. % and $H_2O$ in an amount ranging from about 52 to about 58 wt.%.
11. The method as claimed in claim 8, wherein the etchant has a temperature ranging from about 65 to about 85° C.
12. The method as claimed in claim 8, wherein the etching of the wafer is performed until a thickness of the wafer ranges from about 8 to about 12 $\mu$m.
13. The method as claimed in claim 8, wherein the polishing of said back side is performed until a thickness of the wafer is reduced by an amount ranging from about 1 to about 2 $\mu$m.
14. The method as claimed in claim 8, wherein the polishing of said back side is performed until from about 80 to about 98% of a surface area of said back side can make contact with and electro-static-chuck ("ESC").

* * * * *